United States Patent [19]
Gentsch et al.

[11] Patent Number: 5,347,219
[45] Date of Patent: Sep. 13, 1994

[54] RESONATOR ARRANGEMENT FOR ELECTRON SPIN RESONANCE SPECTROSCOPY

[75] Inventors: Ekkehard Gentsch, Karlsruhe; Dieter Schmalbein, Marxzell-Burbach, both of Fed. Rep. of Germany

[73] Assignee: Bruker Analytische Messtechnik GmbH, Fed. Rep. of Germany

[21] Appl. No.: 923,040

[22] Filed: Jul. 31, 1992

[30] Foreign Application Priority Data

Aug. 2, 1991 [DE] Fed. Rep. of Germany ....... 4125653

[51] Int. Cl.⁵ ............................................. G01R 33/20
[52] U.S. Cl. .................................... 324/316; 324/300
[58] Field of Search .................... 324/316, 318, 300; 333/219, 227, 236, 239

[56] References Cited

U.S. PATENT DOCUMENTS

| | | | |
|---|---|---|---|
| 4,437,063 | 3/1984 | Biehl et al. | 324/316 |
| 4,453,147 | 6/1984 | Froncisz et al. | 324/316 |
| 4,480,239 | 10/1984 | Hyde | 333/219 |
| 4,987,393 | 1/1991 | Yorita et al. | 333/202 |
| 5,051,714 | 12/1991 | Bentivenga | 333/227 |

FOREIGN PATENT DOCUMENTS 3029754 8/1980 Fed. Rep. of Germany .

OTHER PUBLICATIONS

Electron Spin Resonance, Second Edition, A Comprehensive Treatise on Experimental Techniques by Charles P. Poole, Jr., pp. 196–205, Apr. 1983.
GB–Z: J. A. Mackinnon "Variable Temperature (1.6–300K) X–Band EPR System with a Variable Cavity Coupler–in Rev. Sci. Instrum." vol. 43, No. 12, 1972, pp. 1847–1849.

Primary Examiner—Michael J. Tokar
Assistant Examiner—Raymond Y. Mah
Attorney, Agent, or Firm—Claude A. S. Hamrick

[57] ABSTRACT

A resonator arrangement 10 serves for electron spin resonance spectroscopy. It comprises an upper carrier plate 30, a long center portion 32, 33, 40, 41 and a lower resonator section 45, 46, 47. In the area of the center portion 32, 33, 40, 41, there is provided at least one separating plane 50, 51 along which the resonator arrangement 10 can be divided into an upper part 52 and a lower part 52, it being possible to connect a plurality of different lower parts 53 to one and the same upper part 52.

7 Claims, 5 Drawing Sheets

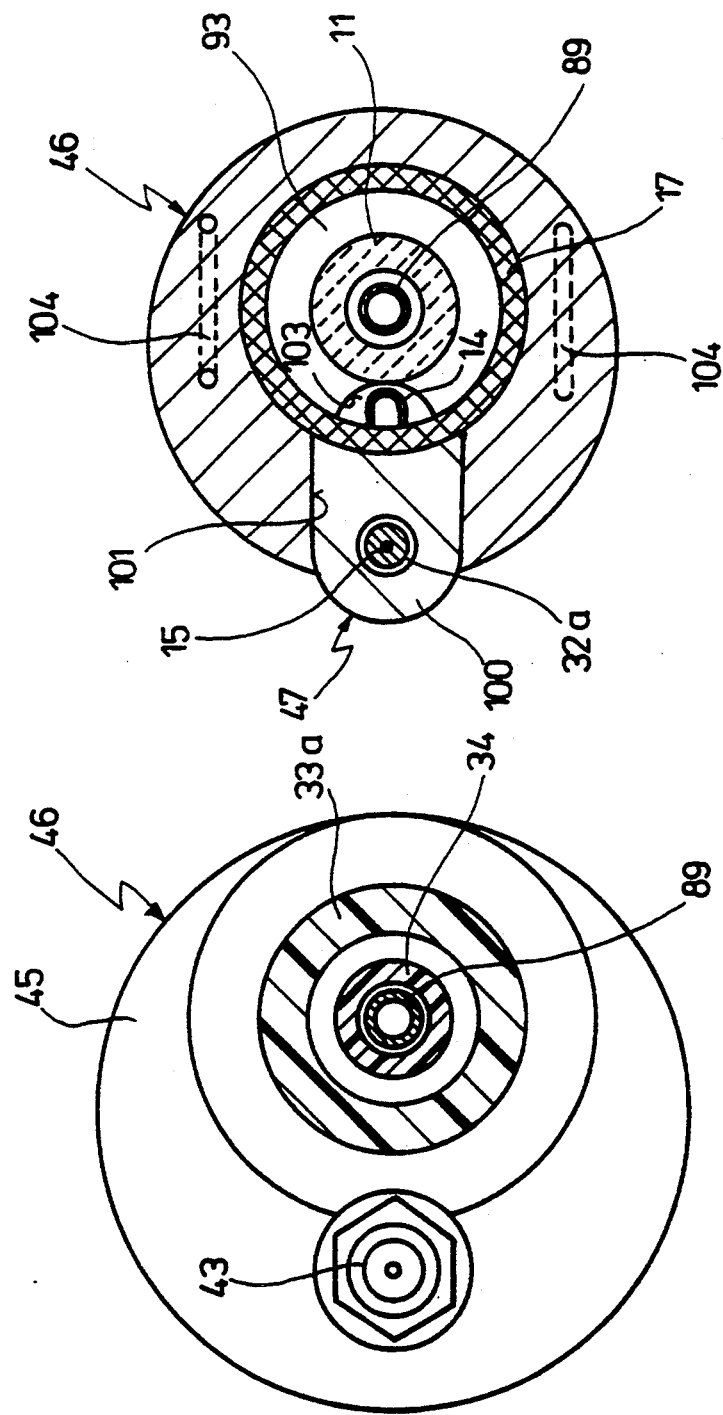

RESONATOR ARRANGEMENT FOR ELECTRON SPIN RESONANCE SPECTROSCOPY

BACKGROUND OF THE INVENTION

The present invention relates to a resonator arrangement for electron spin resonance spectroscopy having an upper carrier plate, a long center portion and a long resonator section.

Resonator arrangements of the before-described type have been known before.

In electron spin resonance spectroscopy, an electromagnetic microwave field is excited in a resonator in order to enable a sample under examination to be exposed to a magnetic microwave field of predetermined direction. The resonator is positioned for this purpose in a constant magnetic field of high homogeneity and intensity, whose field lines extend perpendicularly to the direction of the magnetic microwave field.

Due to the necessary homogeneity of the constant magnetic field, the resonator usually is positioned in a narrow air gap between pole shoes of a laboratory magnet. This means that the space available is very limited. Usual resonator arrangements for electron spin resonance spectroscopy, therefore, consist of the very narrow lower resonator portion, which contains the resonant structure proper (cavity resonator, helix resonator, band resonator) with the sample, a long center portion serving essentially for transferring the microwave signal, and finally an upper carrier section on which the necessary connections are provided.

These connections comprise firstly the connection for the microwave signal, i.e. for example the flange of a hollow waveguide, or a plug-in connection for a microwave coaxial line. The connections further comprise mechanical mounting means, connections for supplying a modulation signal, for carrying off measured voltages, for example of a thermoelement, and connections for supplying or carrying off liquid or gaseous temperature-control agents. Depending on the complexity of the experiment to be carried out, there may also be provided holding means for goniometers in order to enable isotropy measurements to be carried out, further connections for irradiating or passing through optical or other radiation, and the like more. Finally, there have also been known resonator arrangements where the carrier plate comprises an additional feeding arrangement by means of which the sample can be introduced into the resonator section.

For the reasons set out above it is clear that the carrier section or the carrier plate must be given a relatively big size if all the functions enumerated above are to be implemented.

In the case of conventional resonator arrangements, one always designs the particular arrangement for a given experiment, and there is no or hardly any possibility to vary the measuring conditions for one and the same resonator arrangement. This is true in particular if different measuring frequencies of a microwave signal are to be employed, or if temperatures in the area of the measuring sample or different types of resonator arrangements are to be used, for example for continuous-wave measurements on the one hand and pulsed measurements on the other hand, or for measurements with or without irradiation.

With conventional resonator arrangements it is therefore necessary to exchange substantially the whole arrangement if different experiments are to be carried out.

SUMMARY OF THE INVENTION

Now, it is the object of the present invention to further develop a resonator arrangement of the type described above in such a way that the most different measurements can be carried out without having to exchange the whole resonator arrangement.

The invention solves this object by the fact that at least one separating plane is provided in the central section along which the resonator arrangement can be divided into an upper part and a lower part, it being possible to connect a plurality of different lower parts to one and the same upper part.

This solves the problem underlying the present invention fully and perfectly.

The invention makes available a modular resonator concept according to which only those parts have to be exchanged for which a special configuration is required for a given experiment. All other parts, in particular the upper carrier section with the carrier plate and the upper part of the central portion, remain unchanged so that in many cases the measuring set-ups may remain unchanged. The concept further leads to economic advantages since for a plurality of different experiments only the corresponding plurality of different lower parts must be procured, while one and the same upper part can be used for all the experiments so that the upper part has to be procured only once.

According to a preferred further development of the invention, the center portion comprises a sample tube, a microwave line as well as actuator means for a coupling device in the resonator section, and mechanical and electrical connection means are provided in the at least one separating plane.

This feature provides the advantage that the resonator arrangement can be divided in a simple way along the separating planes, simply be releasing the connecting means.

According to a preferred further development of this variant, the microwave line and the actuator device are designed as a common coupling rod.

This feature provides the advantage that a simplified structure is obtained where in addition the number of elements to be separated when separating the resonator arrangement along the separating line is kept as small as possible.

According to another group of embodiments according to the invention, an adaptor flange for a cryostat can be connected to the carrier plate.

This feature provides the advantage that the desired modular concept is transferred also to the temperature-control aspect so that for different cryostats for different temperatures one only has to provide a corresponding adapter in order to adapt the upper part to the respective cryostat.

A particularly good effect is further achieved by the fact that a temperature-control chamber can be connected to the carrier plate.

This feature provides the advantage that the carrier plate can always be kept at room temperature, irrespective of any additional high-temperature or low-temperature devices provided below the carrier plate and/or below the temperature-control chamber.

Preferably, the temperature-control chamber comprises a cavity through which water is circulated.

This feature provides the advantage that the desired thermal decoupling effect can be achieved by simple heat-exchanger means.

According to other preferred embodiments of the invention, a sample rod can be guided in the sample tube, the sample rod carrying a sample on its lower end.

This feature provides the advantage that the sample can be exchanged easily and that the whole resonator arrangement can remain unchanged, except that the sample rod must be introduced to and/or withdrawn from the sample tube.

If according to a preferred further development of this variant the sample rod consists of a glass fiber-reinforced plastic material, then this provides the advantage that the sample can be exchanged even when the process is run at the temperature of liquid nitrogen or that of liquid helium. The sample can then be transferred by means of the sample rod from the cold measuring area to the surrounding room temperature, or vice versa, without having to disassemble the resonator arrangement for this purpose.

Finally, it is preferred in the case of these embodiments of the invention if the lower end of the sample rod is provided with a clamping device for a sample tube.

This feature firstly provides the advantage that the sample can be exchanged quickly. On the other hand, the sample rod need not be pushed in this case as far as the measuring chamber because the sample tube can project axially beyond the lower end of the sample rod so that it can be pushed into the measuring chamber alone.

Other advantages of the invention will appear from the specification and the attached drawing.

It is understood that the features that have been mentioned before and that will be described hereafter may be used not only in the stated combinations, but also in any other combination or each alone, without departing from the scope of the present invention.

BRIEF DESCRIPTION OF THE DRAWINGS

Some embodiments of the invention will now be described in more detail with reference to the drawing in which

FIG. 7 shows a sectional representation taken along line VII—VII in FIG. 6, in still further enlarged scale; and FIG. 8 shows a representation similar to that of FIG. 7, but taken along line VIII—VIII in FIG. 6.

DESCRIPTION OF THE PREFERRED EMBODIMENT

Figure 1:
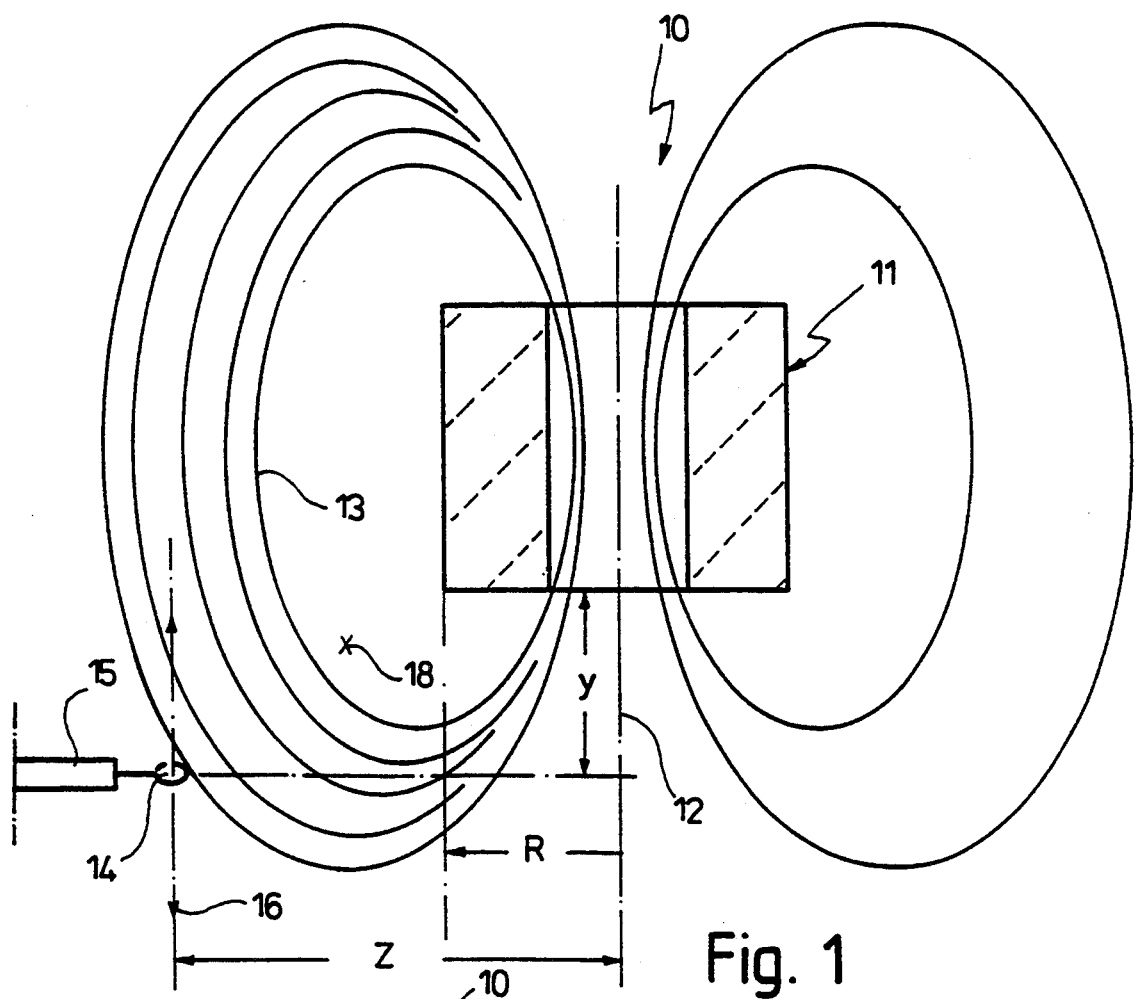
FIG. 1 shows a diagrammatic side view of a resonator arrangement for electron spin resonance experiments comprising a dielectric resonator ring.

In FIG. 1, a resonator arrangement of the type suited for electron spin resonance measurements is indicated generally by reference numeral 10.

11 designates a dielectric ring, i.e. in the illustrated embodiment a hollow-cylindrical body consisting preferably of a sapphire ring. The sapphire ring 11 has a central axis 12. Field lines 13 indicating the electromagnetic microwave field extend within the sapphire ring 11 approximately in parallel to the axis 12 and close in the outer space 18.

Reference numeral 14 indicates a coupling loop provided at a free end of a microwave cable 15, which is indicated in the drawing only in part. The coupling loop 14 serves to excite in the sapphire ring 11 the microwave field symbolized at 13, and/or to couple out measuring signals.

As can be clearly seen in FIG. 1, the coupling loop 14 preferably is positioned in such a way as to be spaced from the bottom face of the sapphire ring 11 by a distance y, viewed in the direction of the axis 12. In addition, there exists a radial spacing z between the coupling loop 14 and the axis 12, the spacing z being greater than the outer radius R of the sapphire ring 11. Generally speaking, the coupling loop 14, therefore, is preferably located radially outside of, and at an axial distance from the sapphire ring 11.

Arrow 16 indicates that the coupling loop 14 can be displaced in the direction of the axis 12. It has been found that displacing the coupling loop 14 in the direction of arrow 16 enables the coupling of the sapphire ring 11 to be varied in the desired manner, which is desirably for electron spin resonance experiments on different samples, with different temperatures, or the like.

Figures 2, 3:
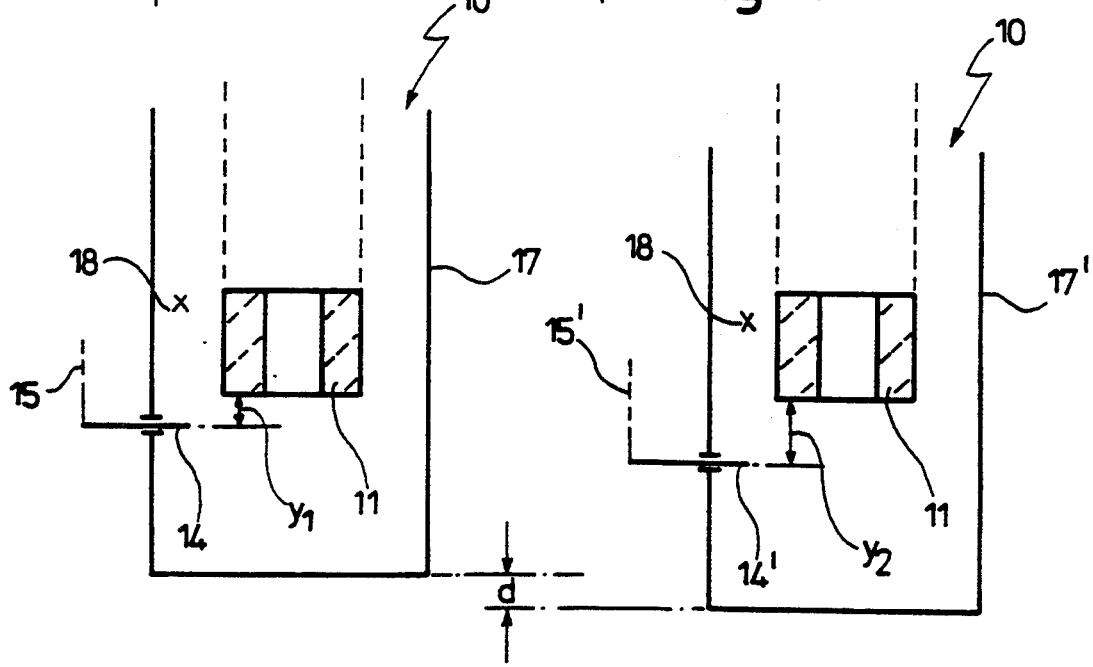
FIG. 2 shows an arrangement similar to that of FIG. 1, but in reduced scale and in a first operating condition.
FIG. 3 shows a representation similar to that of FIG. 2, but in a different operating condition.

Although the sapphire ring 11, being a dielectric ring resonator, is capable also of oscillating freely in space, arrangements are preferred where the ring 11 is enclosed by a screening 17, as illustrated in FIGS. 2 and 3. The screening 17 acts to concentrate the microwave field and to render the latter insensitive to external influences, when certain elements on or in the neighborhood of the ring 11 must be adjusted.

FIG. 2 shows that the microwave cable 15 is passed through a suitable bushing in the jacket of the screening 17 so that the coupling loop 14 finds itself in the outer space 18 between the screening 17 and the ring 11. In the operating condition illustrated in FIG. 2, the coupling loop 14 would then be spaced from the bottom face of the ring 11 by a distance $y_1$.

The broken lines in FIGS. 2 and 3 indicate that for the purposes of the present considerations the ring 11 is held in stationary condition. This is important and desirable for electron spin resonance experiments because the position of the ring 11 in space simultaneously defines the position of the sample located in the ring 11. If, for example, the sample is to be irradiated or to be treated in some other way during an electron spin resonance measurement, then it is desirable for the position of the sample to be maintained as constant as possible and this even in case some adjustment, for example of the coupling device, should be necessary.

It is for this reason that in the case of the microwave resonator 10 according to the invention the coupling loop 14 moves jointly with the screening 17 relative to the ring 11 if the coupling conditions are to be varied.

This can be seen clearly when comparing FIGS. 2 and 3, as in the condition illustrated in FIG. 3 the screening 17' has been lowered by an amount d below the position of the screening 17 in FIG. 2. This has the consequence that the spacing y between the coupling loop 14 and the ring 11 increased from the value $y_1$ in FIG. 2 to the value $y_2$ in FIG. 3 because the ring 11 remained fixed in space.

Figure 4:
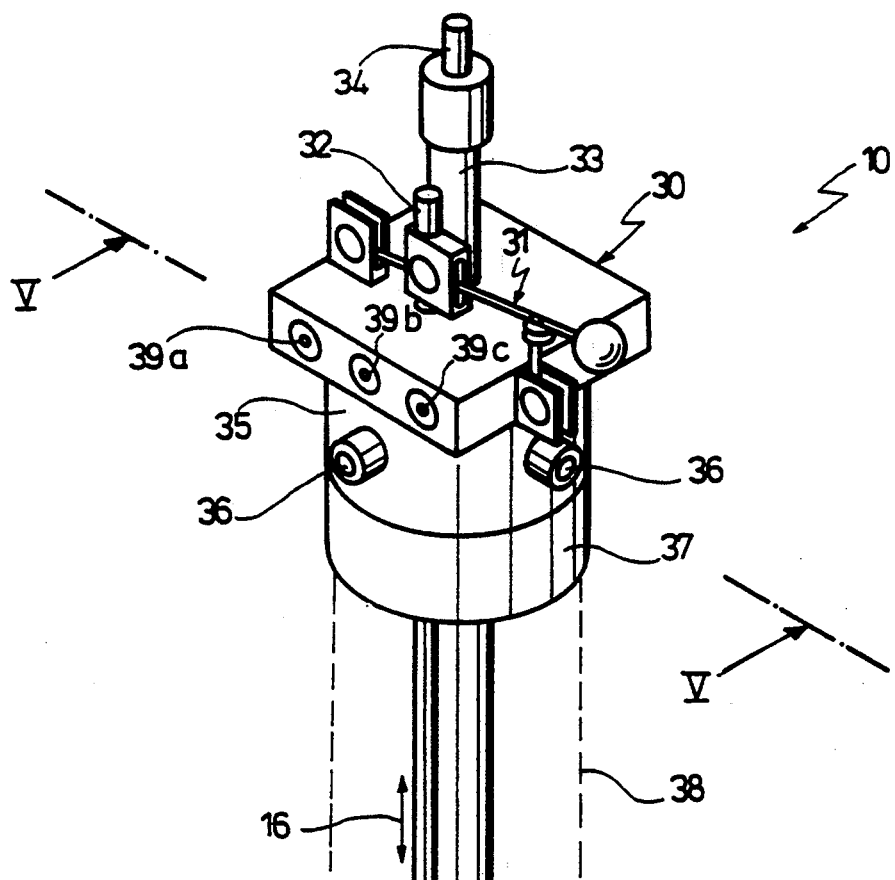
FIG. 4 shows a perspective side view of one embodiment of a resonator arrangement according to the invention.
Figure 4:
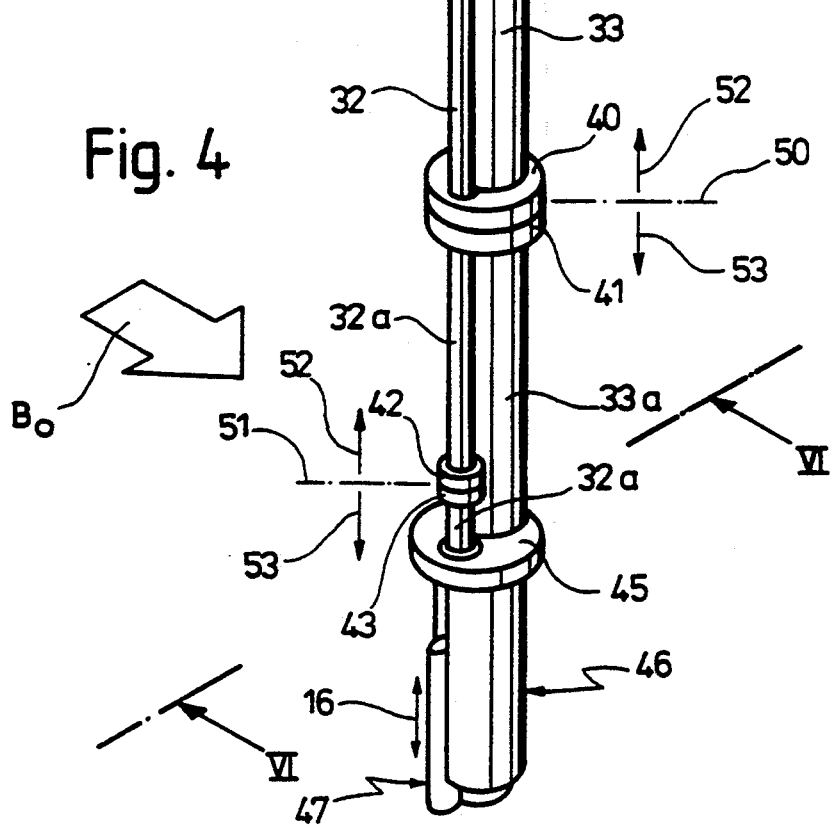

FIG. 4 shows a perspective overall view of one embodiment of a microwave resonator 10 according to the invention.

FIG. 4 will be more easily understood if one realizes that microwave resonators 10 for electron spin resonance experiments usually are long structures with the connections of the microwave line, i.e. a hollow waveguide or a coaxial cable, just as the connections for a modulation signal, for temperature control agents, sensors, and the like, being arranged on the upper end thereof. These installations are then followed by a long central section whose length is selected in such a way that a resonator section located at the lower end can be introduced between pole shoes of a laboratory magnet without this action being obstructed by the normally protruding upper end which is considerably larger than the lower resonator section. It is thus possible to introduce the lower, narrow resonator section into a relatively narrow air gap between two pole shoes of the magnet, while the upper end remains a long way outside of the pole shoes; this provides much more room for the laboratory magnets to establish the necessary connections and to introduce temperature-control agents.

In the case of the resonator 10 according to FIG. 4, a carrier plate 30 can be seen at its upper end, with a coupling mechanism 31 intended to adjust the coupling being mounted thereon. The coupling mechanism 31 will be described in more detail further below, by reference to FIG. 5.

The coupling mechanism 31 is designed in such a way that a vertical coupling rod 32 can be displaced in vertical direction, as indicated again by arrow 16 in FIG. 4.

A rigid sample tube 33, into which a sample rod 34 can be introduced, extends in parallel to the coupling rod 32 and through the carrier plate 30, being held by the latter. The arrangement will be described in more detail further below.

Connected to the bottom of the carrier plate 30 is a temperature-control chamber 35 provided with connections 36 for a temperature-control agent, preferably water.

Below the temperature-control chamber 35, one can see a cryostat flange 37 whose lower face is adapted for connection of a cryostat 38, serving for example for adjusting the temperature to the temperature of liquid nitrogen or of liquid helium. In this case, the temperature-control chamber 35 serves for decoupling the carrier plate thermally from the cryostat 38. This is achieved by guiding a suitable quantity of temperature-control agents through the connections 36 to ensure that low temperatures cannot be transmitted from the area of the cryostat 38 in upward direction and into the area of the carrier plate 30 and the units mounted thereon. 39a, b, and c finally symbolize plug-in connections which can be used, for example, for introducing a modulation signal for modulation coils of the resonator 10, or for picking off the signal of a thermoelement.

As can be clearly seen in FIG. 4, the sample tube 33, extending a long way in downward direction and away from the carrier plate 30, terminates by a flange 40 which is matched by a corresponding counter-flange 41. The counter-flange 41 is followed, in downward direction, by another length of the sample tube forming a separating element 33a.

The same applies by analogy to the coupling rod 32 which, extending initially through the flanges 40, 41, then terminates in downward direction by a connector 42 connected to a matching connector element 43. Following the matching connector element 43, the coupling rod then extends further in downward direction as coupling rod 32a.

As a result of this arrangement, separating planes 50 and 51 are formed in the area of the coupling tube 33/33a and the coupling rod 32/32a, respectively, along which the microwave resonator 10 can be divided into an upper part 52 and a lower part 53, as indicated by the arrows in FIG. 4. This feature makes it possible to use one and the same upper part 52 in combination with a plurality of different lower parts 53, for example lower parts 53 adapted for different measuring frequencies, measuring temperatures, measuring techniques (for example irradiation), or the like.

The sample tube 33a and the coupling rod 32a terminate at their lower end, in the area of the lower part 53, by a flange 45 which is followed in downward direction by a resonator housing 46 and a coupling and screening element 47 that will be discussed in more detail further below in connection with FIG. 6.

Finally, $B_0$ in FIG. 4 indicates the direction of the constant magnetic field to which the lower part 53 is exposed.

Figure 5:
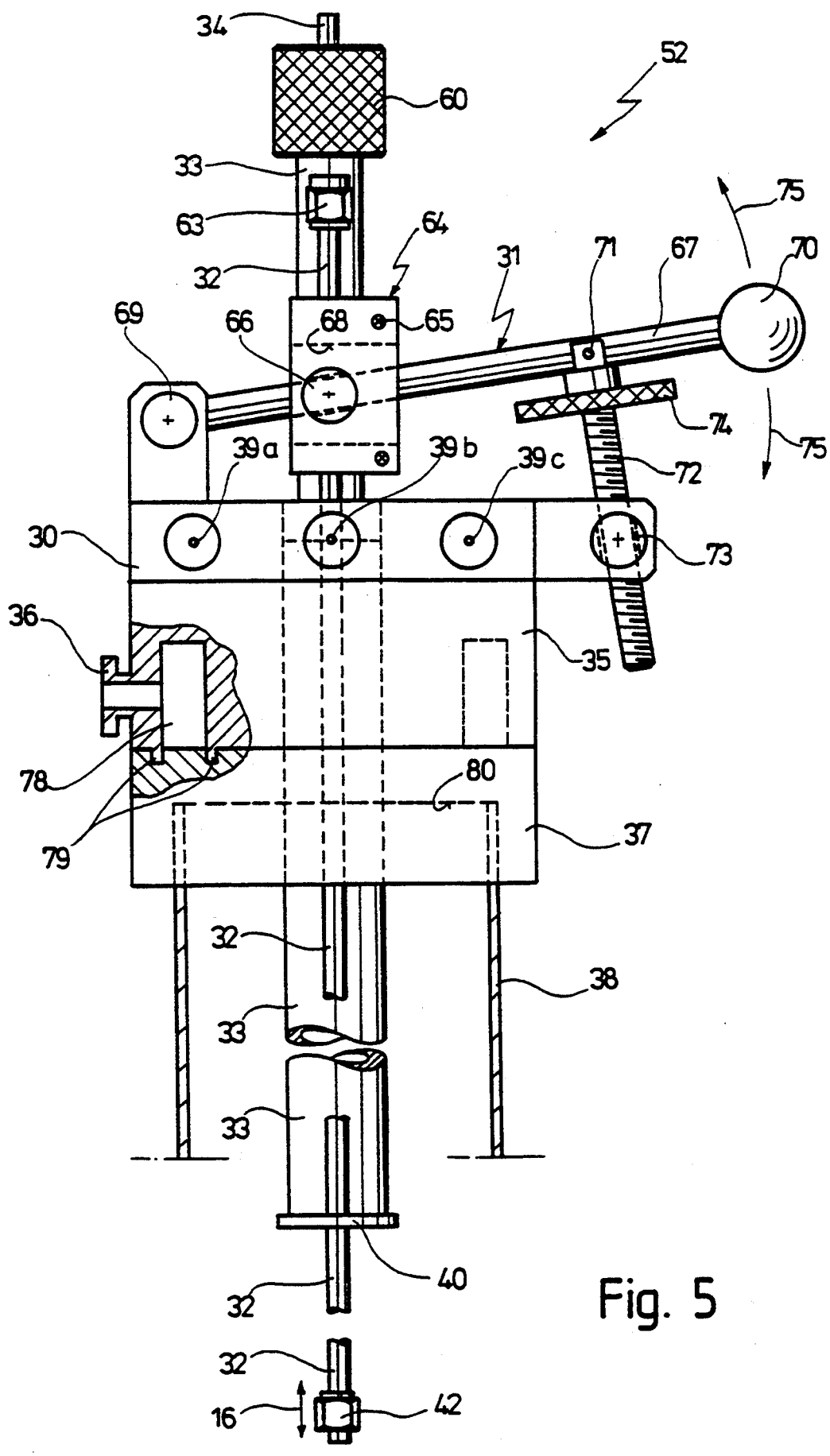
FIG. 5 shows a side view in the direction of arrows V—V in FIG. 4 of the upper part of the resonator arrangement illustrated in FIG. 4, in enlarged scale.

FIG. 5 shows further details of the upper part 52.

As regards the sample tube 33, it can be seen that its upper end is provided with a chuck 60. In its released condition, the chuck 60 enables the sample rod 34 to be introduced from above, whereafter the rod 34 can be secured in the measuring position by tightening the chuck 60.

The coupling rod 32 consists essentially of a rigid or semi-rigid microwave line, preferably a semi-rigid coaxial microwave cable, which may be mechanically stabilized, at least over certain sections, by an additional reinforcing tube, or the like. The upper end of the coupling rod 32 terminates by a connector 63 through which microwave energy can be introduced, or signals coupled out from the resonator can be picked off.

A short way below the connector 63, the coupling rod 32 is rigidly held, in axial direction, in a drive element 64. This is effected by clamping screws 65 by which the coupling rod 32 is clamped in the drive element 64. The drive element 64 is part of the coupling mechanism 31 which will now be discussed in greater detail:

The drive element 64 is provided with a combined pivot and sliding bearing 66 in which a rod 67, which in the view of FIG. 5 can be seen in front of the coupling rod 32, is supported for axial displacement in a direction perpendicular to the drawing plane, while it can also swing about the axis of the combined pivot and sliding bearing 66. The rod 67 is passed for this purpose through an oblong hole 68 in the drive element 64, and its left end - as viewed in FIG. 5—is fastened in a pivot bearing 69 of the carrier plate 30. The right end of the rod 67 is provided with a handle 70 by means of which the rod 67 can swing about the axis of the pivot bearing 69, as indicated by arrows 75.

Between the drive element 64 and the handle 70, a threaded spindle 72 is connected to the rod 67 via an articulation 71. The threaded spindle 72 is held in a combined pivot and sliding bearing 73 of the carrier plate 30 in sliding and swinging relationship. This makes it possible for the rod 67 to perform the swinging movement indicated by arrows 75. In order to enable the rod 67 to be locked in a given angular position, a knurled nut 74 is mounted on the threaded spindle 72. The knurled nut 74 can be screwed against the combined pivot and sliding bearing 73 in order to thereby fix the threaded spindle 72 in axial direction.

It will be easily appreciated that any swinging movement of the rod 67 in the direction indicated by arrows 75 will automatically entail a displacement of the drive element 64 in vertical direction whereby the coupling rod 32 is displaced in the direction of arrow 16.

In FIG. 5 it can be further seen that the temperature-control chamber 35 is provided with an annular space 78 that communicates with the connections 36 which are indicated only diagrammatically, with one of them being illustrated in FIG. 5. It can be ensured in this way that, provided a sufficient quantity of a temperature-control agent is circulated, the temperature-control chamber 35 can always be maintained at a uniform temperature, preferably near room temperature, even if a considerably lower temperature should prevail at the bottom of the temperature-control chamber 35, in the area of the cryostat flange 37.

The temperature-control chamber 35 and the cryostat flange 37 are interconnected by a labyrinth seal 79—indicated only diagrammatically in FIG. 5—so that once the temperature-control chamber 35 and the cryostat flange 37 have been joined, the annular spaces 78 is hermetically sealed.

The cryostat flange 37 is provided on its lower face with a recess 80 in which the cryostat 38 can be fitted. In the case of the embodiment illustrated in the drawing, the cryostat 38 is indicated in the form of a nitrogen cryostat, i.e. a long evacuated glass vessel in whose interior the temperature of the liquid nitrogen can be maintained. It is understood, however, that reference numeral 38 may also be interpreted to indicate a helium cryostat, which must have a considerably more complex structure in order to enable the temperature of liquid helium to be adjusted in its interior.

Figure 6:
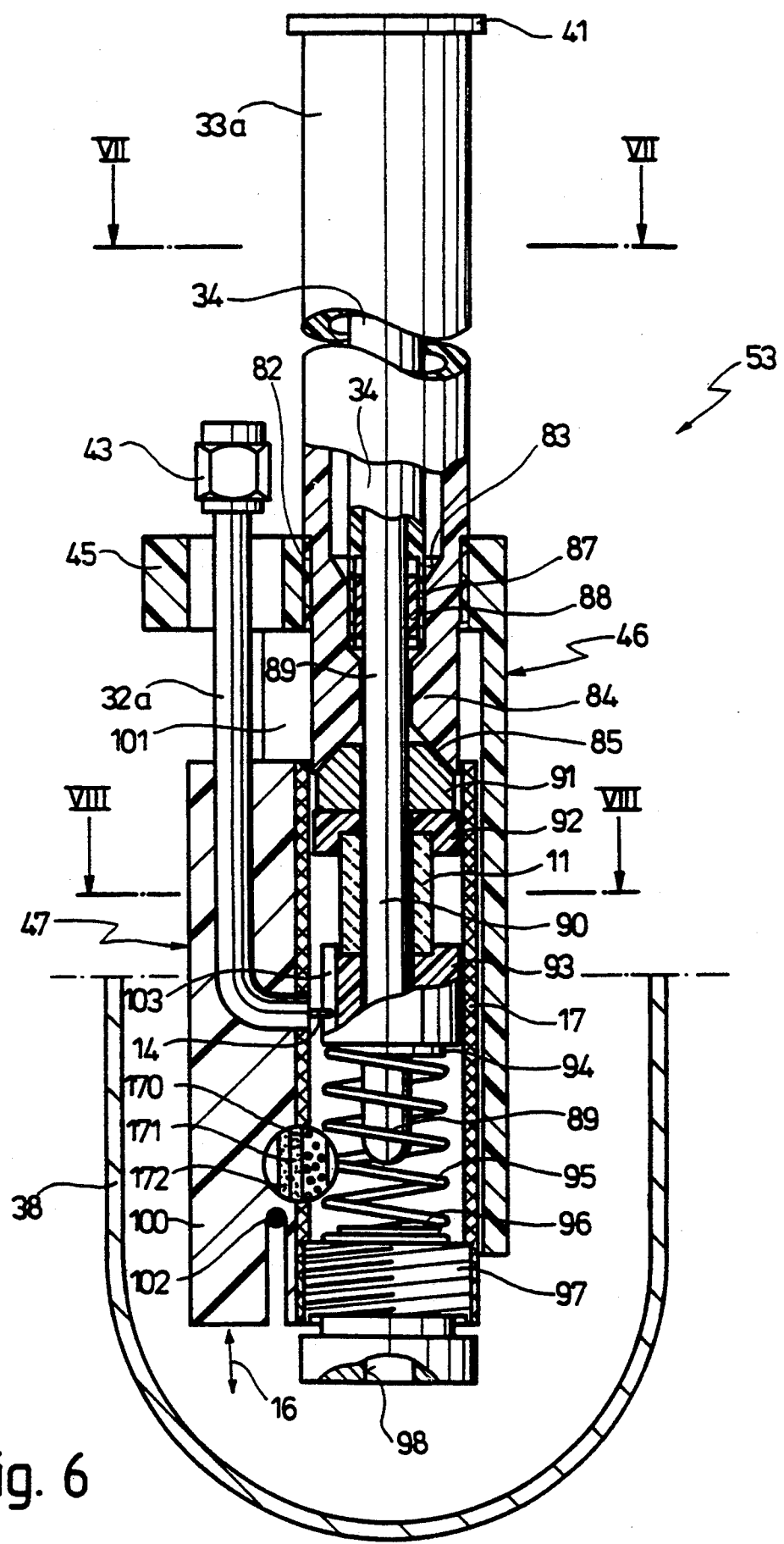
FIG. 6 shows a side view, cut open in part, in the direction of arrows VI—VI in FIG. 4, depicting the lower part of the resonator arrangement in still further enlarged scale.

FIG. 6 shows further details of the lower part 53 of the resonator 10.

As regards the sample tube 33a, it will be seem immediately in FIG. 6 that its lower end is screwed into the flange 45 by means of a thread 82. In the area of the thread 82, the sample tube 33a is provided with an internal, conically tapering centering portion 83 terminating at the bottom by a guide section 84 of reduced diameter, which latter is then followed by an internally conical section 85 opening up again toward the bottom.

The sample rod 34 is guided in concentric relationship to the sample tube 33a. The sample rod 34 consists, preferably, of a glass fiber-reinforced plastic material. The sample rod 34 can be withdrawn from and re-inserted into the sample tube 33 or 33a during an experiment so that samples can be exchanged even during measurements carried out at low temperatures, without the need to remove the entire resonator portion of the resonator 10 from the cold area of the cryostat 38.

The lower end of the sample rod 34 terminates by a terminal section section 87 provided with an internal thread. Fitted in the internal thread is a clamping nut 88 serving to clamp a sample tube 89. The sample tube 89 contains a sample 90 to be examined.

Contrary to all the other elements that have been described above and all of which consist of a plastic material, a centering cone 91, which is fitted in the internally conical section 85 from below, consists of a metal.

The centering cone 91 is followed, in downward direction, by an upper holding element 92 supporting the top of the sapphire ring 11. The bottom of the sapphire ring 11 is held by a lower holding element 93. The bottom of the lower holding element 93 is provided with a spigot 94 for a compression spring 95. The lower end of the compression spring 95 is compressed around a spigot 9 of a metallic or microwave-absorbent closure screw 97. The closure screw 97 is provided with a passage bore 98 in order to permit the sample tube 89 to extend further in downward direction than indicated by way of example in FIG. 6.

FIG. 6, regarded in combination with FIG. 8, further shows clearly the structure of the coupling and screening element 47 and the way in which it is guided in the resonator housing 46.

The element 47 consists essentially of a screening 17 in the form a tube. The lower end of the tube is engaged by the closure screw 97 which is screwed into the tube by a corresponding thread.

The tube as such preferably consists of three layers 170, 171, 172 which are depicted more clearly in the enlarged detail in FIG. 6.

Each layer 170, 171, 172 consists of a wire coil, the innermost layer 170 being wound from a somewhat thicker wire, while the outer layers 171, 172 are wound from a somewhat thinner wire. This measure serves the purpose to achieve a screening 17 which on the one hand is tight under HF aspects but which on the other hand allows a low-frequency modulation field to pass.

One end of the tube of the screening 17 is provided with a lug 100 engaging a corresponding groove 101 in the resonator housing 46. A locking pin 102 ensures that the coupling and screening element 47 cannot get disengaged from the resonator housing 46 in downward direction under the action of the compression spring 95.

Now, when the coupling mechanism 31, which has been described in detail further above by reference to FIG. 5, is actuated to displace the coupling rod 32a in vertical direction—as viewed in FIG. 6—then this has the effect to move the coupling and screening element 47 together with the screening 17 relative to the resonator housing 46 in the direction indicated by arrow 16, and the compression spring 95 is simultaneously compressed or released, respectively.

The coupling loop 14 occupies in this case for example the position outside of and below the sapphire ring 11, as illustrated in FIG. 6 and as described above in connection with FIG. 1. In order to ensure undisturbed displacement of the coupling loop 14, the respective area of the lower holding element 93 is provided with a vertical groove 103 which can be clearly seen in FIGS. 6 and 8.

Finally, FIG. 8 further shows that modulation coils 104 are arranged on, or molded into the resonator housing 46, conveniently on both sides of the tubular screening 17.

For operation of the resonator according to the invention, one initially selects a suitable lower element 53 for the experiment to be carried out, which must be suited, for example, for the desired measuring frequency (for example X-or Q-band) or for a given measuring temperature (for example room temperature, temperature of liquid nitrogen or of liquid helium) or for a given measuring technique (for example measurement under irradiation, under defined angular rotation).

For this purpose, the arrangement is such that all these different lower parts 53 can be fitted on the same upper part 52.

Once the resonator 10 has been assembled in this way, it is brought into the measuring position, i.e. introduced between the poles of the laboratory magnet and, if necessary, into a cryostat 38.

One then introduces the sample 90, or a corresponding sample substance, into the sample tube 89. The filled sample tube 89 is clamped in the clamping nut 88 in the terminal portion 87 of the sample rod 34. With the chuck 60 in the released condition, one then introduces the sample rod 34 into the sample tube 33 from above. When the sample tube 89 assumes the position illustrated in FIG. 6, in which the sample 90 is located in the sapphire ring 11, one tightens the chuck 60 so as to fix the sample rod 34 in its position in the sample tube 33.

One can now proceed to carrying out the electron spin resonance measurement. To this end, one initially establishes the necessary coupling to the sapphire ring 11 by untightening the knurled nut 74 on the threaded spindle 72 of the coupling mechanism 31 (FIG. 5) and displacing the rod 67 by means of the handle 70 in the direction indicated by arrow 75 until optimum coupling to the sapphire ring 11 is achieved.

One then fixes the rod 67 and, thus, the coupling loop 14 via the coupling mechanism 31 and the coupling rod 32, in their respective positions by tightening the knurled nut 74 against the combined pivot and sliding bearing 73.

Now, the electron spin resonance measurement as such can be carried out.

If the sample is to be exchanged, this is possible in a simple way be removing the sample rod 34, together with the sample tube 89, from the sample tube 33 and introducing it again, filled with a new sample, and after the coupling conditions have again been optimized the next measurement can be carried out. It is, therefore, not necessary to remove the entire resonator 10 from the air gap of the magnet, or at least from the cryostat, if one is employed.

We claim:

1. An electron spin resonance resonator comprising:
   a) a carrier plate carrying
      i) means for inserting a sample into said resonator,
      ii) means for feeding microwave energy to said resonator, and
      iii) means for adjusting microwave coupling to said resonator;
   b) an elongate intermediate section extending along an axis and having a first end and a second end, said first end being connectable to said carrier plate, said intermediate section having
      i) axial sample guide means connectable, at said first end, to said sample inserting means and terminating in a first axially oriented connector disposed at said second end of said intermediate section,
      ii) a rigid axial microwave line connectable, at said first end, to said microwave feeding means and to said microwave coupling adjusting means, said microwave line terminating in a second axially oriented connector disposed at said second end of said intermediate section and;
   c) a modular cavity section having a first end and a second end and a microwave cavity formed therein, said cavity section having,
      i) axial sample receiving means having a proximal end in communication with said cavity and having a distal end terminating in a third axially oriented connector adapted for connecting to said first axially oriented connector, and
      ii) cavity coupling means being displaceable relative to said cavity, said cavity coupling means having a first end coupled to said cavity and having a second end terminating in a fourth axially oriented connector adapted for connecting to said second axially oriented connector,
   whereby when said first and said third connectors are mated with each other, a sample may be inserted into said cavity via said sample inserting means, said sample guide means, and said sample receiving means and
   when said second and said fourth connectors are mated with each other, microwave energy is fed into said cavity via said microwave feeding means and said axial microwave line and, simultaneously, said cavity coupling means is activated by said rigid axial microwave line thereby adjusting the microwave coupling.

2. The resonator of claim 1, wherein said carrier plate is provided with an adaptor flange adapted for attaching to a cryostat for receiving said intermediate section and said cavity section.

3. The resonator of claim 1, wherein said carrier plate is provided with a thermosetting chamber.

4. The resonator of claim 3, wherein said thermosetting chamber comprises a thermosetting cavity and means for circulating a temperature-control agent through said thermosetting cavity.

5. The resonator of claim 1, further comprising an elongate sample rod for carrying said sample at one end thereof, said sample rod being adapted to be inserted into said sample inserting means, through said sample guide means and through said sample receiving means for positioning said sample within said cavity.

6. The resonator of claim 5, wherein said sample rod is made from a glass fiber reinforced plastic material.

7. The resonator of claim 5, wherein said sample rod has a clamping means at one end for clamping a sample tube therein.

* * * * *